(12) United States Patent
Pöchmüller

(10) Patent No.: US 6,490,191 B2
(45) Date of Patent: Dec. 3, 2002

(54) METHOD AND CONFIGURATION FOR COMPENSATING FOR PARASITIC CURRENT LOSSES

(75) Inventor: Peter Pöchmüller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,262

(22) Filed: Jul. 3, 2001

(65) Prior Publication Data

US 2002/0006068 A1 Jan. 17, 2002

(30) Foreign Application Priority Data

Jul. 3, 2000 (DE) .......................................... 100 32 273

(51) Int. Cl.[7] .............................................. G11C 7/02
(52) U.S. Cl. ................................... 365/158; 365/230.06
(58) Field of Search ........................... 365/158, 230.06, 365/206, 157

(56) References Cited

U.S. PATENT DOCUMENTS 4,300,214 A * 11/1981 Bruder ........................ 365/196
4,409,674 A * 10/1983 Takahashi .................... 365/190

FOREIGN PATENT DOCUMENTS

DE        19853447 A1      5/2000

* cited by examiner

*Primary Examiner*—Tan T. Nguyen
(74) *Attorney, Agent, or Firm*—Laurence A. Greenberg; Werner H. Stemer; Ralph E. Locher

(57) ABSTRACT

A method and a configuration are provided for compensating for parasitic current losses in an MRAM memory cell array. Individual word lines and bit lines are supplied with currents which are proportioned in such a way that a total current level at respective points of intersection between the word lines and the bit lines is substantially constant.

5 Claims, 1 Drawing Sheet

METHOD AND CONFIGURATION FOR COMPENSATING FOR PARASITIC CURRENT LOSSES

BACKGROUND OF THE INVENTION

FIELD OF THE INVENTION

The present invention relates to a method and a configuration for compensating for parasitic current losses in a memory cell array including word lines, bit lines which cross the word lines, and memory cells that are provided at points of intersection between the word lines and the bit lines and through which parasitic currents resulting in the parasitic current losses flow.

A memory cell array of a conventional MRAM is illustrated in FIG. 2 and described in greater detail below. In such a memory cell array, memory cells are located at points of intersection having total current levels which stipulate magnetic fields that are available locally for programming the memory cells and can fluctuate greatly. Since the memory cells have a magnetic hysteresis, and particular threshold values need to be exceeded in order to program them, such fluctuations in the magnetic field are extremely undesirable. Therefore, memory cells all having substantially the same structure and threshold values cannot be programmed by using the same magnetic fields.

SUMMARY OF THE INVENTION

It is accordingly an object of the invention to provide a method and a configuration for compensating for parasitic current losses in a memory cell array, which overcome the hereinafore-mentioned disadvantages of the heretofore-known methods and configurations of this general type and which permit magnetic fields of the same size to be provided for the individual memory cells in each case.

With the foregoing and other objects in view there is provided, in accordance with the invention, a method for compensating for parasitic current losses in a memory cell array. The method comprises providing the memory cell array with word lines, bit lines crossing the word lines at points of intersection, and memory cells disposed at the points of intersection for conducting parasitic current flows resulting in the parasitic current losses. Currents individually fed into the word lines and bit lines are proportioned, in such a way that a sum of currents flowing through the word lines and the bit lines associated with each individual point of intersection is substantially constant at the points of intersection.

In the method according to the invention, the word lines and bit lines are thus supplied with currents having a size which is proportioned by taking into account the voltage drop arising across each memory cell. This is done in such a way that the total current level at the points of intersection between the word lines and the bit lines has a value which is substantially constant over the memory cell array. In this context, it is naturally not necessary for exactly the same total current level to be present at all points of intersection. Instead, it is sufficient if the current level at the individual points of intersection has substantially the same size. This can also be achieved by virtue of particular groups of word lines and bit lines being driven by using the same current in each case, which means that certain tolerable discrepancies from the ideal total current level may arise within the individual group. However, in any case, the invention permits fundamental compensation of the parasitic current loss in the individual word lines and bit lines by merely ensuring that the currents supplied to these word lines and bit lines have sizes substantially compensating for the parasitic current losses.

With the objects of the invention in view, there is also provided a configuration for compensating for parasitic current losses in a memory cell array having word lines, bit lines crossing the word lines at points of intersection, and memory cells disposed at the points of intersection for conducting parasitic current flows resulting in the parasitic current losses. The configuration comprises word line drivers and bit line drivers for individually supplying differently proportioned currents to the word lines and the bit lines, causing a sum of currents flowing through the word lines and the bit lines associated with each individual point of intersection to be substantially constant at the points of intersection.

In accordance with a concomitant feature of the invention, the memory cell array is a memory cell array of an MRAM.

Other features which are considered as characteristic for the invention are set forth in the appended claims.

Although the invention is illustrated and described herein as embodied in a method and a configuration for compensating for parasitic current losses, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 2:
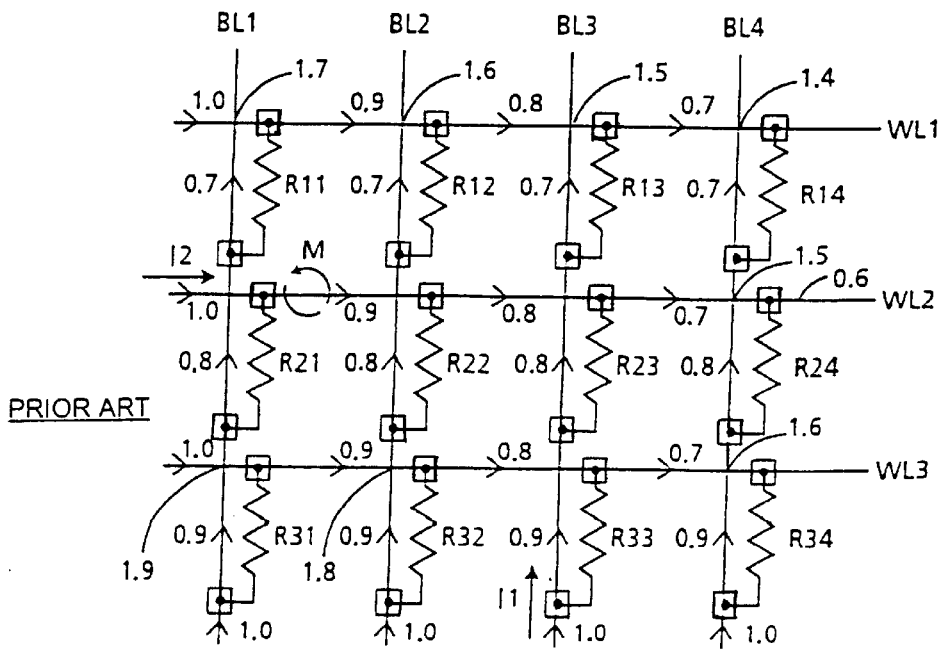
FIG. 2 is a schematic circuit diagram of an MRAM's memory cell array supplied with currents of constant size in a conventional manner.

Referring now in detail to the figures of the drawings, in which mutually corresponding components are provided with the same reference symbols, and first, particularly, to FIG. 2 thereof, there is seen a structure of an MRAM memory cell array (MRAM=Magnetic Random Access Memory), as an example of a memory cell array in a semiconductor memory configuration. The MRAM includes word lines WL1, WL2, WL3, . . . and bit lines BL1, BL2, BL3, BL4, . . . which intersect the word lines WL1, WL2, WL3 . . . substantially at right angles. Memory cells are located at points of intersection between the word lines WL1, WL2, WL3, . . . and the bit lines BL1, BL2, BL3, BL4, . . . The memory cells are each indicated by a resistor R11, R12, . . . , R33, R34, which are referred to in general by reference symbol Rij.

The resistor Rij represents a path of a tunneling current flowing between a word line, for example the word line WL2, and a bit line, for example the bit line BL3, when a voltage difference exists between that word line WL2 and that bit line BL3. The tunneling current then assumes a relatively large or relatively small value depending on a magnetic field written to the memory cell. In other words, the memory cell can be regarded as a binary resistor programmed with a relatively large or relatively small resistance value. Those two resistance values can then be allocated an information unit "1" or "0".

A memory cell is thus programmed by applying a magnetic field. Thus, in order to program a memory cell to a value "0" or "1", the magnetic field needs to exceed certain threshold values. In that context, it should be noted that the memory cell has a magnetic hysteresis.

As is indicated in FIG. 2, a direct current I2 flowing in the word line WL2, for example, creates a magnetic field M around that word line WL2. In that context, the direction of the magnetic field M is reversed if the current I2 flows in the opposite direction. Thus, the direction of the magnetic field M indicates whether a "1" or a "0" is being written to a memory cell.

It may now be assumed that the current I2 in the word line WL2 signifies the information unit "1". All of the memory cells connected to the word line WL2, that is to say the memory cells having the resistors R21, R22, R23 and R24, have the magnetic field M applied to them by the current I2. The hysteresis of the memory cells with the resistors R21, R22, R23 and R24 then means that the magnetic field M on its own is not yet strong enough to transfer all of those memory cells from a "0" state to a "1" state. Instead, it is additionally necessary for a bit line, for example the bit line BL3, to be driven by using a current I1 in order to create a magnetic field at the intersection between the bit line BL3 and the word line WL2 which is strong enough, as a result of superimposition of the magnetic fields created by the currents I1 and I2, to transfer the "0" state to a "1" state at the intersection, that is to say in the resistor R23. In other words, by driving selected word lines WLi and selected bit lines BLj, it is possible to program the memory cells at the intersections between those word lines and bit lines to a "0" state or a "1" state, depending on the direction of the magnetic field created by the respective currents.

However, during that programming, a problem arises which can be attributed to the parasitic current loss through the network formed from the resistors Rij. If, by way of example, the current I2 at the start of the word line WL2 has a size of 1 mA (indicated by "1.0" in the figure), that value drops to a lower value after each resistor R21, R22, R23, R24 connected to the word line WL2. In order to simplify the explanation, it may be assumed that the voltage drop across each resistor is 0.1 mA. In that case, the current I2 thus has a size of 0.9 mA after the resistor R21, a size of 0.8 mA after the resistor R22, a size of 0.7 mA after the resistor R23, and a size of 0.6 mA after the resistor R24. The actual values differ therefrom, but may be determined in a relatively simple manner by virtue of an appropriate network simulation. Those actual values also depend on the equivalent resistance of each individual memory cell, although that is of no importance for understanding the invention.

A corresponding drop in the size of the currents also occurs on the bit lines BL1, BL2, BL3 and BL4 and will be assumed to be 0.1 mA in each case after each resistor Rij, as in the case of the word lines. Thus, in the bit line BL1, the current has a size of 0.9 mA after the resistor R31, a size of 0.8 mA after the resistor R21, and a size of 0.7 mA after the resistor R11. A corresponding situation applies for the bit lines BL2 to BL4.

The points of intersection between the word lines WLi and the bit lines BLj then have current levels produced by superimposition of the individual currents in the respective lines. Thus, by way of example, the total current level including the current I2 and the current I1 at the point of intersection between the word line WL2 and the bit line BL3 is 0.8 mA+0.8 mA=1.6 mA. The corresponding current level at the intersection between the word line WL1 and the bit line BL4 measures 1.4 mA. By contrast, the point of intersection between the word line WL3 and the bit line BL1 has a current level of 1.9 mA. Corresponding values can be stated for the rest of the points of intersection in the memory cell array. However, the total current level at the respective points of intersection stipulates the magnetic field available locally for programming the memory cells, which can fluctuate greatly, as follows from the example of FIG. 2, with current values between 1.9 mA and 1.4 mA. Since the memory cells have a magnetic hysteresis, and particular threshold values need to be exceeded in order to program them, such fluctuations in the magnetic field are extremely undesirable. In other words, the memory cells, which all have substantially the same structure and have the same threshold values, should be able to be programmed by using the same magnetic fields as far as possible.

Figure 1:
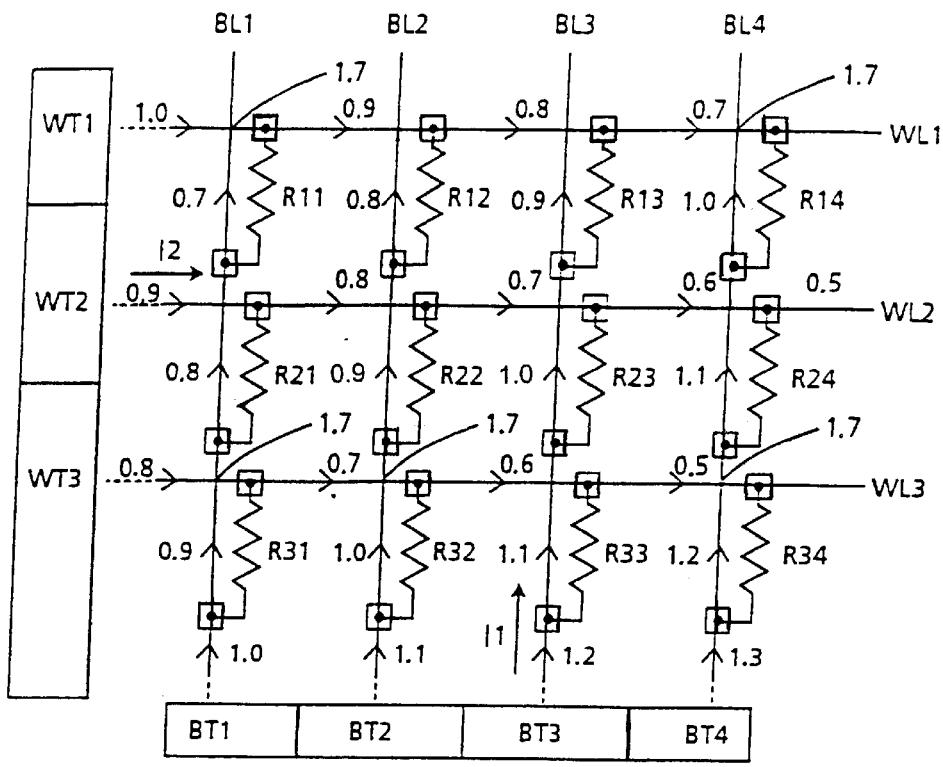
FIG. 1 is a schematic and block circuit diagram of a memory cell array of an MRAM, for the purpose of illustrating the method according to the invention.

FIG. 1 shows a memory cell array of an MRAM in which word line drivers WT1, WT2, WT3 supply the word lines WL1, WL2 and WL3 with respective currents having a size of 1.0 mA, 0.9 mA and 0.8 mA, respectively. Similarly, bit line drivers BT1, BT2, BT3 and BT4 in this MRAM memory cell array feed the bit lines BL1, BL2, BL3 and BL4 with currents of 1.0 mA, 1.1 mA, 1.2 mA and 1.3 mA, respectively.

If, as assumed in the example of FIG. 2, a voltage drop of 0.1 mA now arises across each memory cell or across each resistor Rij, the current I2 output by the word line driver WT2 has a size of 0.8 mA after the resistor R21, a size of 0.7 mA after the resistor R22, a size of 0.6 mA after the resistor R23, and a size of 0.5 mA after the resistor R24. Similarly, the current I1 supplied to the bit line BL3 by the bit line driver BT3 has a size of 1.1 mA after the resistor R33, a size of 1.0 mA after the resistor R23, and a size of 0.9 mA after the resistor R13.

Accordingly, this means that all of the points of intersection in the memory cell array of FIG. 1 have the same total current levels at the points of intersection between the individual word lines WLi and the bit lines BLj. Thus, the total current level at the point of intersection between the word line WL2 and the bit line BL3 is 0.7 mA+1.0 mA=1.7 mA. Similarly, the total current level at the point of intersection between the word line WL3 and the bit line BL1 is 0.8 mA+0.9 mA=1.7 mA. The same applies for the point of intersection between the word line WL1 and the bit line BL4, for which 0.7 mA+1.0 mA=1.7 mA is true.

The inventive method and the inventive configuration thus ensure that the total current level in the respective word lines and bit lines has a substantially constant value overall at the individual points of intersection between the word lines and the bit lines. This is achieved by virtue of the individual driving currents output by the word line drivers and bit line drivers being suitably proportioned.

As has already been mentioned above, it is also possible for individual groups of word lines and bit lines to be provided with the same currents in each case, with certain discrepancies from an ideal value then being accepted. However, such discrepancies are acceptable so long as a certain degree of compensation for parasitic current losses is achieved.

The invention may preferably be used in an MRAM. However, it may also be used advantageously in memory cell arrays for other memories if currents which are as constant as possible are required for the individual memory cells in these memories.

I claim:

1. A method for compensating for parasitic current losses in a memory cell array, which comprises:

providing the memory cell array with word lines, bit lines crossing the word lines at points of intersection, and memory cells disposed at the points of intersection for conducting parasitic current flows resulting in the parasitic current losses; and proportioning currents individually fed into the word lines and bit lines, causing a sum of currents flowing through the word lines and the bit lines associated with each individual point of intersection to be substantially constant at the points of intersection.

2. The method according to claim 1, which further comprises carrying out the step of proportioning the currents individually fed into the word lines and bit lines to take into account parasitic currents arising in the memory cells.

3. The method according to claim 1, which further comprises carrying out the step of proportioning the currents individually fed into the word lines and bit lines to provide groups of the word lines and the bit lines with currents proportioned to be the same in each case.

4. In a memory cell array having word lines, bit lines crossing the word lines at points of intersection, and memory cells disposed at the points of intersection for conducting parasitic current flows resulting in parasitic current losses, a configuration for compensating for the parasitic current losses, comprising:

word line drivers and bit line drivers for individually supplying differently proportioned currents to the word lines and the bit lines, causing a sum of currents flowing through the word lines and the bit lines associated with each individual point of intersection to be substantially constant at the points of intersection.

5. The configuration according to claim 4, wherein the memory cell array is an MRAM memory cell array.

* * * * *